United States Patent
Becker et al.

(10) Patent No.: US 8,759,120 B2
(45) Date of Patent: Jun. 24, 2014

(54) SILICON SOLAR CELL

(75) Inventors: Mike Becker, Bremen (DE); Dietmar Lütke-Notarp, Köln (DE)

(73) Assignee: Atotech Deutschland GmbH, Berlin (DE)

( * ) Notice: Subject to any disclaimer, the term of this patent is extended or adjusted under 35 U.S.C. 154(b) by 375 days.

(21) Appl. No.: 13/205,133

(22) Filed: Aug. 8, 2011

(65) Prior Publication Data

US 2011/0318872 A1    Dec. 29, 2011

Related U.S. Application Data

(63) Continuation-in-part of application No. PCT/DE2010/000148, filed on Feb. 9, 2010.

(30) Foreign Application Priority Data

Feb. 9, 2009  (DE) .......................... 10 2009 008 152

(51) Int. Cl.
  *H01L 21/00*  (2006.01)
  *H01L 29/06*  (2006.01)

(52) U.S. Cl.
  USPC .................. 438/22; 438/24; 438/26; 257/13; 257/79

(58) Field of Classification Search
  USPC .......... 438/22, 24, 26, 98; 257/10, 13, 79, 80, 257/82, 91, 98–100
  See application file for complete search history.

(56) References Cited

U.S. PATENT DOCUMENTS

| | | | |
|---|---|---|---|
| 3,664,874 A | 5/1972 | Epstein | |
| 4,321,283 A | 3/1982 | Patel et al. | |
| 5,011,567 A | 4/1991 | Gonsiorawski | |
| 2002/0084503 A1 | 7/2002 | Lee et al. | |
| 2006/0022330 A1* | 2/2006 | Mallari | 257/717 |
| 2009/0139568 A1* | 6/2009 | Weidman et al. | 136/256 |
| 2009/0205712 A1* | 8/2009 | Cousins | 136/261 |
| 2009/0309098 A1* | 12/2009 | Balucani | 257/48 |
| 2011/0006874 A1 | 1/2011 | Becker et al. | |
| 2011/0259218 A1 | 10/2011 | Becker et al. | |

FOREIGN PATENT DOCUMENTS

| | | |
|---|---|---|
| EP | 0 325 606 B1 | 9/1994 |
| JP | 2004 266023 | 9/2004 |
| WO | WO 2007/106180 | 9/2007 |

* cited by examiner

*Primary Examiner* — Hsien Ming Lee

(74) *Attorney, Agent, or Firm* — Renner, Otto, Boisselle & Sklar, LLP

(57) ABSTRACT

A silicon solar cell includes a first silicon layer with an emitter layer which has a thickness in a range of 50 nanometers to few hundreds nanometers. The emitter layer has at least one region which is porosified by chemical or electrochemical etching, wherein at least one part of the porosified region is embodied as metal silicide layer. A second silicon layer is disposed underneath the emitter layer, with the metal silicide extending from a top side of the emitter layer in a direction to the second silicon layer. At least one metal layer is applied on the metal silicide layer.

14 Claims, 4 Drawing Sheets

SILICON SOLAR CELL

CROSS-REFERENCES TO RELATED APPLICATIONS

This application is a continuation-in-part of prior filed copending PCT International application no. PCT/DE2010/000148, filed Feb. 9, 2010, which designated the United States and has been published as International Publication No. WO 2010/088898 A2 and on which priority is claimed under 35 U.S.C. §120 and which claims the priority of German Patent Application, Serial No. 10 2009 008 152.6, filed Feb. 9, 2009, pursuant to 35 U.S.C. 119(a)-(d).

The contents of PCT/DE2010/000148 and DE 10 2009 008 152.6 are incorporated herein by reference in its entirety as if fully set forth herein.

BACKGROUND OF THE INVENTION

The present invention relates to a silicon solar cell, and to a method for producing such a solar cell.

The following discussion of related art is provided to assist the reader in understanding the advantages of the invention, and is not to be construed as an admission that this related art is prior art to this invention.

A silicon solar cell includes an n-doped and p-doped silicon layer. If photons impinge on a side of the solar cell acting as emitter, charge balancing or a current flow between the two layers occurs, which can be conducted away via contacts. A contact strip composed of metal having many contact fingers is usually applied on the top side of such a solar cell, whereas a continuous metal layer is present as contact on the underside. The contact strip and the metal area form the electrical poles of the solar cell.

A contact strip and metal fingers have hitherto been formed by means of a silver paste, which are applied to the surface in a printing method. One disadvantage here is that the electrical leads formed from the silver paste have a relatively high conduction resistance since the silver paste is structured in porous fashion. Moreover, the contact resistance between the silver paste and the silicon layer arranged underneath is relatively high and the adhesion to the substrate is relatively poor.

To increase efficiency of solar cells, it has been proposed for example to provide a smaller thickness of the emitter layer. As the thickness of the emitter layer is only a few hundred nanometers, the approach to make them even thinner is problematic because the metallic electrical leads can penetrate through such a thin emitter layer, with the result that such a solar cell is electrically short-circuited.

It would therefore be desirable and advantageous to provide an improved solar cell to obviate prior art shortcomings.

SUMMARY OF THE INVENTION

According to one aspect of the present invention, a silicon solar cell includes a first silicon layer including an emitter layer which has a thickness in a range of 50 nanometers to few hundreds nanometers, the emitter layer having at least one region which is porosified by chemical or electrochemical etching, wherein at least one part of the porosified region is embodied as metal silicide layer, a second silicon layer disposed underneath the emitter layer, said metal silicide extending from a top side of the emitter layer in a direction to the second silicon layer, and at least one metal layer applied on the metal silicide layer.

According to another advantageous feature of the present invention, at least 50% of the metal silicide layer can be delimited to the porosified region. Advantageously, at least 70% of the metal silicide layer can be delimited to the porosified region. Currently preferred is at least 90% of the metal silicide layer being delimited to the porosified region.

Although a metal applied directly onto silicon has a relatively low electrical conduction resistance, the mechanical adhesion is still relatively poor since the applied metal can readily detach from the silicon during subsequent process steps. By virtue, however, of the fact that a compound composed of metal and silicon in the form of a metal silicide is produced according to the invention, it is possible to achieve a low electrical contact resistance between the metal and the silicon.

In the case of the solar cell according to the invention, the metal silicide is formed in a region within the emitter layer that is porosified by chemical or electrochemical etching. This is advantageous since the etching gives rise to a fissured structure which can be metalized well and ensures a good adhesion between the metal and the silicon. Moreover, the metal silicide forms more rapidly in the region which is porosified after the etching and which is provided with a reactive surface than in the adjacent, non-porosified region, with the result that a large part of the metal silicide formed can be delimited to the porosified region. The porosified region thus effects a delimitation in the height of the metal silicide.

Moreover, the porosified region can be set in terms of its height in a simple manner very precisely and only up to a small height since an etching process can be temporally precisely delimited. This means that, in the case of such a solar cell, the metal silicide does not extend along the entire emitter height, but rather only in a region proceeding from a top side of the emitter layer, the height of which region is smaller than the height of the entire emitter layer. Through-metallization or a short circuit with the silicon layer adjacent to the emitter layer can thus be prevented. The etching thus permits very controlled porosification, with the result that it is possible to produce a region with a metal silicide in a very thin emitter layer, the thickness of which is only a few hundred nanometers to approximately 50 nanometers.

According to the invention, a metal layer is applied on the metal silicide. A metal layer adheres very well on a metal silicide layer, with a low electrical contact resistance between these two layers being achieved. The metal layer then forms together with the metal silicide an electrical lead of the solar cell. It is advantageous if the metal layer comprises nickel, copper or silver, wherein it is particularly advantageous if said metal layer is applied chemically or electrochemically and, consequently, is not porous in comparison with a printed paste and therefore has a lower conduction resistance.

The silicon layer preferably comprises a layer with highly n-doped silicon. It has been observed that a silicon layer of this type is attacked to a different magnitude in comparison with a lightly doped silicon layer during the action of an etching medium. A layer having high n-type doping can be etched in a shorter time than a layer having a low doping. This observation can be utilized advantageously for the production of the solar cell according to the invention. What is achieved with a highly n-doped silicon layer is that the etching depth in the emitter and thus the height of the porosified region or the height of the metal silicide subsequently formed can be delimited in a simple manner. This is accomplished even in the case of an emitter layer having a thickness of only a few hundred nanometers to 50 nanometers, without an electrical short circuit of the solar cell occurring.

According to another advantageous feature of the present invention, an antireflection layer can be applied on the emitter layer. The antireflection layer has the effect that a smaller proportion of the incident light is reflected by the solar cell, with the result that a higher efficiency of the solar cell can be achieved. The antireflection layer can include silicon nitride, silicon oxide or tin oxide, the latter being electrically conductive in contrast to the others.

According to another advantageous feature of the present invention, the antireflection layer can be formed from porous silicon. This layer is formed over the whole area over the surface of the solar cell. Advantageously, this layer can be a part of the emitter and is delimited to a thickness of a few hundred nanometers to 50 nanometers. The advantage is that such an antireflection layer no longer has to be patterned in order to carry out the metallization. The porosification can be effected without patterning and without a masking layer. Consequently, a masking layer that has to be resistant to hydrofluoric acid is not required. After the porosification, it is then possible to apply a masking layer which is patterned, with the result that regions with and without a masking layer arise. In the regions without a masking layer, a coating with a metal layer can be effected. This is followed by heating of the emitter layer and metal layer, with the result that a metal silicide layer forms.

According to another advantageous feature of the present invention, the metal of the metal silicide and the metal of the metal layer applied on the metal silicide can be identical. Relatively simple fabrication is thus possible.

According to another aspect of the present invention, a method for producing a silicon solar cell composed of a wafer with a silicon layer, includes the steps of etching a layer selected from the group consisting of silicon layer that forms an emitter layer, and an already formed emitter layer, with the emitter layer having a thickness in a range of 50 nanometers up to few hundred nanometers, by using an etching medium such as to porosify the layer at least in one region, forming a patterned masking layer on a surface of a wafer side having the emitter layer to produce a region with masking layer and a region without masking layer, galvanically coating the porosified emitter layer in the region without masking layer with a first metal layer by contacting the porosified silicon with a metal-containing electrolyte, heating the emitter layer and the first metal layer until a metal silicide layer forms in at least one part of the porosified region and extends from a top side of the emitter layer in a direction to an adjacent silicon layer, and removing the masking layer.

The masking layer can either be applied in a manner such that it is already patterned, for example by means of a screen printing method, or be applied over the whole area and be patterned subsequently by using a layer, for example. The patterning is effected in such a way that a region with masking layer and a region without masking layer arise, wherein, in the region without masking layer, the patterning is carried out until the emitter layer is uncovered. If a further layer, for example an antireflection layer, is present under the masking layer, the patterning is carried out until, in the region without masking layer, the antireflection layer has also been removed and the emitter layer situated underneath is uncovered. The patterning makes it possible to produce a narrow region or channel whose bottom or base, in this embodiment the uncovered emitter layer, can be attacked by an etching medium.

The etching in the region without masking layer or of the uncovered emitter layer has the effect that a porous structure can be produced at the surface of the layer. Such etching and production of a porous structure at the surface can be effected in temporally greatly delimited fashion, such that the etching attack of the emitter layer is effected only to a small depth. It is thus ensured, even in the case of a very thin emitter layer, that the porosified region does not reach the layer situated below the emitter layer, whereby a short circuit can be avoided. The porosification is particularly advantageous since a surface treated in this way has a fissured structure which can readily receive and mechanically anchor a metal layer to be applied. In addition, a low electrical contact resistance between the metal layer and the silicon emitter layer is achieved. Furthermore, a material porosified by etching is very reactive, with the result that, upon heating of the emitter layer and the metal layer, a metal silicide layer is formed in a simple manner even at low temperatures, which metal silicide layer adheres well and has a low electrical resistance. It is only as a result of the porous structure that a satisfactory adhesion and a low electrical resistance can be achieved.

The sequence described can also be changed, however. Thus, it is likewise possible firstly to etch the emitter layer using an etching medium, with the result that the emitter layer is porosified. In this case, the etching attack can be delimited to a zone or take place on the entire surface of the emitter layer. This can be followed by the step in which a patterned masking layer is produced, with the result that a region with masking layer and a region without masking layer are present. This is followed by the coating of the porosified emitter layer in the region without masking layer with a first metal layer, then the heating of the emitter layer and the first metal layer, and then the removal of the masking layer. This is advantageous since the etching thus takes place without a masking layer and a masking layer that has to be resistant to an etching medium is not required.

Furthermore, it is possible to etch a silicon layer which is not yet an emitter layer and does not become formed as an emitter layer until in a further method step by means of doping. In this embodiment, therefore, the doping does not take place before the etching, as described above, but rather only after the etching. Once the emitter layer has been formed, the steps as mentioned above can subsequently follow, namely that a patterned masking layer is produced, a coating with a first metal layer is effected, then a metal silicide is formed and the masking layer is thereupon removed.

If the masking layer does not withstand without damage the temperature that arises during the heating for forming the metal silicide, it can be removed before the heating step. The coating with a metal layer is preferably effected without external current or chemically or electrochemically. This can be done for example in such a way that, in the case of an n-doped emitter silicon layer, the coating is effected by making contact between the porosified silicon and an electrolyte comprising metal and depositing metal in and/or on the porosified and cathodically polarized silicon. The masking layer has the effect that the lateral expansion of the metal layer to be constructed is effected within the etched-free channel of the masking layer. The deposited metal penetrates partly into the depths of the porosified structure and can additionally be constructed up to a predetermined height depending on the chosen process parameter (voltage, current intensity, electrolyte concentration or time). However, it is also possible for the deposition of the metal to be effected in such a way that the metal only passes into the depths of the porosified structure and fills the free spaces there, but no further layer is subsequently constructed.

The patterning of the masking layer makes it possible to produce a narrow channel, such that the metal silicide and a metal layer possibly formed thereon have a narrow line width. This is advantageous since it is thus possible to form a solar cell having leads which, on account of their narrow width, bring about only a small covering of the irradiated area of the solar cell. A lead produced in this way has a smaller covering area than in the case of the conventional method wherein, for a lead, a silver paste is applied to the surface in a printing method. With such a silver paste it is possible only to produce metal fingers or leads whose width is greater than their height, with the result that a minimum height should not be undershot for a sufficiently low electrical resistance of a metal finger. However, this means a minimum width of greater than 100 µm, with the result that a minimum area of the solar cell is covered by metal fingers. By virtue of the patterned masking layer, it is possible to produce line widths of less than 100 µm, with the result that, for the same dimensions of a solar cell, a smaller area is covered and a higher efficiency of the solar cell can be achieved.

During an electrolytic deposition, metal can also be applied to the emitter layer under the action of light. In such a case, the rear side of the silicon wafer acquires a cathodic contact, with the anode being situated in the electrolyte. The cell is then reverse-biased, while an increased photocurrent flows as a result of the action of light on the emitter layer, which photocurrent provides for the electroplating at the emitter surface. This is advantageous since it is therefore not necessary to make contact with the emitter layer within the medium, and the customary problems such as electroplating of the contact or layer thickness fluctuation of the emitter layer on account of the extraneous field influence of the contact location are avoided. The photocurrent makes it possible to avoid the disadvantage that a highly conductive start layer is not yet present on the surface of the emitter layer, as is otherwise usual in the case of an electrolytic coating.

In the case of an n-doped emitter silicon layer, the porosification of the silicon layer can be effected by electrochemical etching with anodic polarization of the silicon layer, wherein the silicon layer is dipped into the etching medium. This is advantageous since the same arrangement as during coating can be chosen, but with an interchanged polarity. The silicon layer is anodically polarized during etching, with the result that the layer is porosified. For the subsequent coating, there is no need for modification or demounting of the silicon wafer, and no need to carry out rinsing steps and the like, whereby time is saved. There are no wetting problems either, since the electrolyte is already contained in the pores during etching and does not first have to penetrate therein for the coating.

The electrical contact-making for the cathodic or anodic polarization of the silicon can be effected outside the electrolyte, with the result that the contacts and the lead are not exposed to an electric field in the electrolyte and are not concomitantly electroplated or concomitantly etched.

According to another advantageous feature of the present invention, the etching medium can be the electrolyte comprising metal, with the result that the same electrolyte can be used for the etching and the coating. The etching medium can comprise hydrofluoric acid, a tension-reducing agent such as, for example, a surfactant, alcohol or acetic acid, and a metal salt, preferably with the composition 25% by volume of hydrofluoric acid, 25% by volume of ethanol, 25% by volume of nickel sulphate solution or nickel chloride solution comprising 80 to 185 g/l of nickel and 25% by volume of water.

Another advantageous composition dispenses with ethanol, manages with less than 25% by volume of hydrofluoric acid and provides nickel acetate up to the solubility limit. In another composition, the concentration of the hydrofluoric acid can be 25% by volume, wherein nickel acetate is contained up to the solubility limit, with the result that higher current densities of up to 60 mA/cm$^2$ can be achieved during the porosification. At concentrations of between 5% by volume and 10% by volume of hydrofluoric acid, porosification can be effected with a current density of up to 30 mA/cm$^2$. A high nickel content permits high current densities during the nickel deposition; at a lower nickel concentration, the current-carrying capacity of the electrolyte turns out to be correspondingly lower.

A further advantageous composition comprises: 5% by volume to 10% by volume of hydrofluoric acid, 150 g/l to 180 g/l of nickel acetate dissolved to the solubility limit, a tension-reducing agent, e.g. anionic comprising sodium dodecyl sulphate ($C_{12}H_{25}NaO_4S$), or cationic comprising cetyltrimethylammonium bromide ($C_{19}H_{42}BrN$) or non-ionic comprising a p-tert-octylphenol derivative e.g. in the product Triton® X-100.

If only one side of the solar cell to be produced is exposed to an electrolyte, and contact can therefore be made with one side in dry fashion, simple contact-making can be achieved.

The step of heating for forming the metal silicide layer can be effected in a range of 250° C. to 700° C., preferably in a range of 250° C. to 400° C. In the case of porosified silicon, formation of silicide is already possible in the low temperature range of 250° C. to 400° C., with the result that the silicon is subjected to a lower thermal loading. As a result of this, during the formation of metal silicide, it is possible to achieve a selectivity in terms of the depth between porosified silicon and non-porosified silicon. The low temperature suffices for forming a metal silicide with the porous silicon, but the formation of a metal silicide with the non-porosified region requires higher temperatures or proceeds at that temperature with a significantly low rate.

According to another advantageous feature of the present invention, after the formation of the metal silicide layer, the remaining first metal layer can be removed and a first metal layer is thereupon deposited again. What is thus achieved is that reaction layers such as oxide layers, for example, are removed after the formation of metal silicide, with the result that the first metal layer applied subsequently can securely adhere.

According to another advantageous feature of the present invention, a second metal layer can subsequently be formed in the region in which the metal silicide layer is formed. The conduction resistance can thus be reduced overall. If the metal silicide layer is a nickel silicide, it is possible for example to apply three further metal layers in the order nickel, copper and tin or in the order nickel, copper, silver. In the case of a silver silicide as metal silicide, the second metal layer can comprise silver.

According to another advantageous feature of the present invention, after the first metal layer has been applied to the porosified silicon, heating is not yet carried out, rather a second metal layer is formed onto the first metal layer. As a result, the masking layer can remain on the wafer, in particular on an antireflection layer, with the result that no incorrect deposition takes place at porous locations in the antireflection layer. The deposition still takes place in the etched region of the masking layer, whereby the lateral propagation of the metal layers can be reliably delimited to the width of the etched region. The heating then takes place after the complete application of the metal layers and removal of the masking layer. Since the metallization is present on porous silicon with good adhesive bonding, the masking layer can be removed without the metal layers being detached. In the case of a coating of metal without a porosified substrate, it would not be possible to form metal silicide after the removal of a masking layer. Since the silicon is present in porous form, the first metal layer can reliably form a metal silicide with the silicon during heating, without a loss of adhesion occurring.

According to another advantageous feature of the present invention, the masking layer may include a resist that can be applied by means of screen printing. It is not necessary to use a photopatternable resist. Rather, the resist can have free locations in the regions in which the metallization is subsequently intended to be effected. Advantageously, the resist is resistant to hydrofluoric acid, acetone, ethanol, nitric acid, alkaline solutions such as potassium hydroxide solution or sodium hydroxide solution.

In accordance with the present invention, a solar cell is provided whose electrical leads have a low electrical conduction resistance, have a low electrical contact resistance with respect to the silicon layer and have high adhesive strength. In addition, this is intended to be reliably achieved in the case of a solar cell having a very thin emitter layer of a few hundred nanometers to approximately 50 nanometers, without the solar cell being electrically short-circuited.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
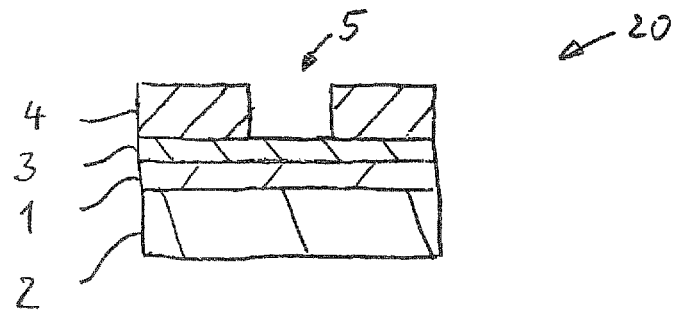
FIG. 1 shows a cross-sectional view of a wafer as starting material of a silicon solar cell in accordance with a first embodiment.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a cross-sectional view of a wafer, generally designated by reference numeral 20 and including an n-doped silicon layer 1 and a p-doped silicon layer 2. The n-doped layer has a height of e.g. 200 nanometers and acts as an emitter layer, while the p-doped layer as carrier material (bulk) has a height of 100 to 200 micrometers. An antireflection layer 3 composed of silicon nitride, for example, is formed on the n-doped layer 1, said antireflection layer having a height of e.g. 100 nanometers. The antireflection layer 3 is not absolutely necessary, but is advantageous since it serves to reduce a reflection of the light radiated in onto the n-doped emitter layer 1. In the case of the embodiment illustrated in FIG. 1, a masking layer 4 is applied on the surface of a side of the wafer 20 which has the emitter layer 1. Since an antireflection layer 3 is provided in the case of this embodiment, the masking layer 4 is not situated directly on the n-doped silicon layer 1, but rather on the antireflection layer 3. The masking layer 4 has at least one free space 5 that extends as far as the layer situated underneath, the antireflection layer 3 in the case of this embodiment. The free space can arise as a result of patterning of the masking layer. However, it is likewise possible for the masking layer to be applied to the antireflection layer with a free space already present.

Figure 2:
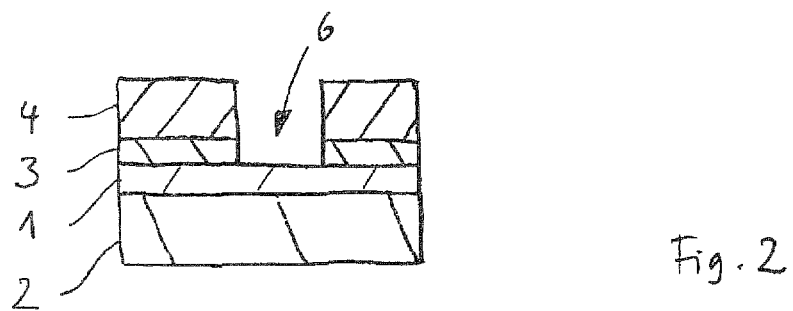
FIG. 2 shows a cross-sectional view of the wafer in accordance with the first embodiment after a second method step.
Figure 3:
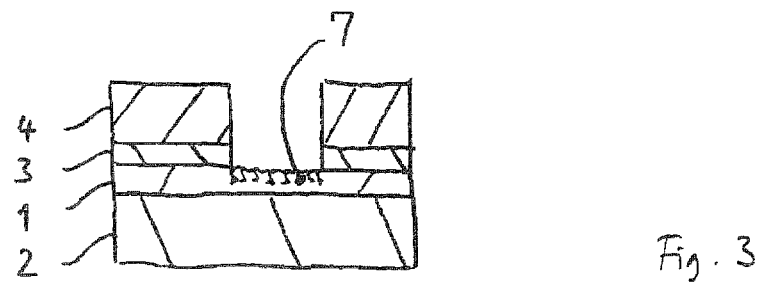
FIG. 3 shows a cross-sectional view of the wafer in accordance with the first embodiment after a third method step.

If the wafer is subjected to an etching medium that passes into the free space 5, in a second method step the etching medium is allowed to act until the antireflection layer has been completely etched away at the bottom of the free space 5, as shown in FIG. 2. In the event of longer action of the etching medium, the latter also attacks the layer situated underneath, here the n-doped silicon layer 1, as shown in FIG. 3. This n-doped silicon layer 1 thereupon becomes porous with regard to its structure, as indicated by reference symbol 7. In the case of a short time of action of the etching medium on the n-doped silicon layer 1, the etching attack can be delimited in terms of its depth. This is additionally supported if the etching process is effected electrochemically and if the n-doped layer 1 has a region which is highly n-doped and is weakly n-doped underneath. The highly n-doped region is attacked relatively rapidly by an etching medium, while the region arranged underneath is attacked only little. What can thus be achieved is that the porous structure does not reach the boundary region 8 between n-doped layer and p-doped layer, with the result that an electrical short circuit can be avoided. If a current-voltage curve is recorded during the porosification, the reaching of the lightly n-doped layer can be identified in a simple manner by virtue of the fact that the voltage rises.

After the porosification, in a further method step, a first metal layer 9, e.g. nickel, is introduced into the porous structure 7.

Figure 4:
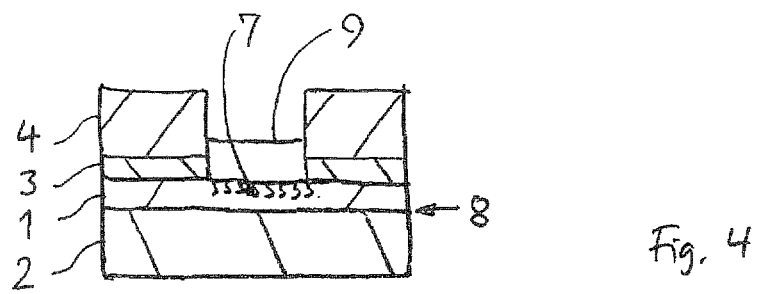
FIG. 4 shows a cross-sectional view of the wafer in accordance with the first embodiment after a fourth method step.

Given appropriately chosen process parameters, the first metal layer 9 can also be applied even further, with the result that the first metal layer 9 is provided not only within but also on the porous structure 7, as shown in FIG. 4. The metal layer 9 is situated within the free space 5 present from the masking layer 4 and has a width corresponding to the width of the free space 5.

Figure 5:
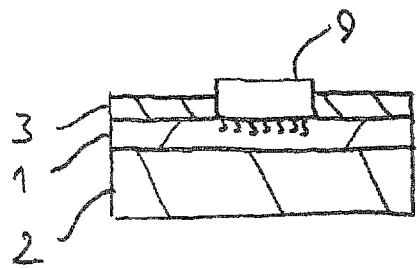
FIG. 5 shows a cross-sectional view of the wafer in accordance with the first embodiment after a fifth method step.
Figure 6:
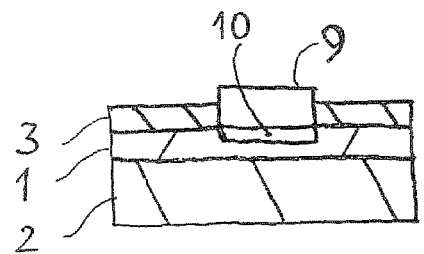
FIG. 6 shows a cross-sectional view of the wafer in accordance with the first embodiment after a sixth method step.
Figure 7:
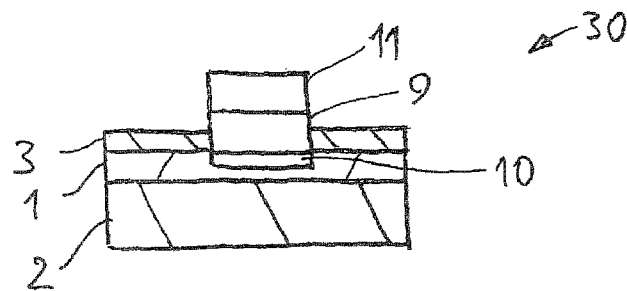
FIG. 7 shows a cross-sectional view of the wafer in accordance with the first embodiment after a seventh method step.

In the next method step, as shown in FIG. 5, in the case of the first embodiment, the masking layer 4 is removed. This is followed by heating of at least the porosified silicon layer together with the first metal layer, with the result that a metal silicide layer 10, e.g. a nickel silicide, forms, as shown in FIG. 6. On account of the porous structure 7, good adhesion between the metal 9 and the silicon 1 arises. In a further method step, as shown in FIG. 7, a second metal layer 11 can be constructed onto the first metal layer 9, whereby a solar cell 30 is formed.

Figure 8:
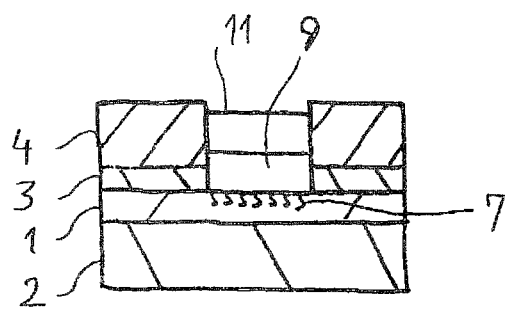
FIG. 8 shows a cross-sectional view of the wafer as starting material of a silicon solar cell in accordance with a second embodiment after a fifth method step.
Figure 9:
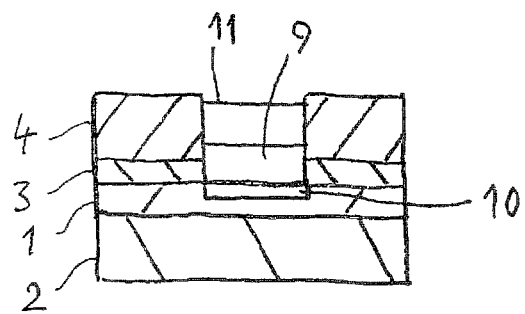
FIG. 9 shows a cross-sectional view of the wafer in accordance with the second embodiment after a sixth method step.

As an alternative to the fifth method step in the case of the first embodiment, in which the masking layer is removed, in the case of a second embodiment it is possible for a second metal layer 11 to be applied to the first metal layer 9 with a masking layer 4 still present, as shown in FIG. 8. This is followed, in a further method step, by the heating of at least the porosified silicon 7 with the first metal layer 9, as shown in FIG. 9, with the result that a metal silicide 10 is formed. The masking layer 4 is thereupon removed, with the result that, in the case of this second embodiment as well, a solar cell 30 is formed, as shown in FIG. 7. If the masking layer 4 does not withstand without damage the temperature arising during the heating for forming the metal silicide, it is removed before the heating step.

Figure 10:
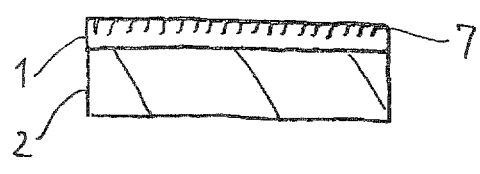
FIG. 10 shows a cross-sectional view of the wafer in accordance with a third embodiment after a first method step.
Figure 11:
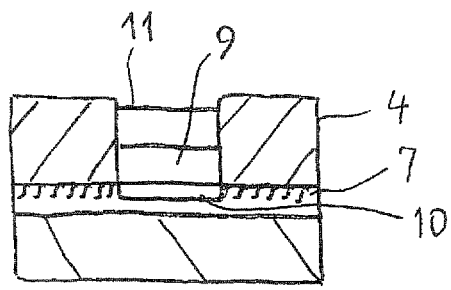
FIG. 11 shows a cross-sectional view of the wafer in accordance with the third embodiment after a fifth method step.

FIG. 10 shows a third embodiment of the wafer after a first method step. The wafer has a silicon layer which can simultaneously act as an antireflection layer. In a first method step, the entire surface of the silicon layer 1 is etched, with the result that the layer is porosified. Afterwards, a masking layer 4 is applied, which is already patterned or still has to be patterned. A region without masking layer thus arises, which region can be coated with a first metal layer 9 and a second metal layer 11. This is followed by heating of the silicon layer 1 and the first metal layer 9, with the result that a metal silicide 7 forms, as shown in FIG. 11. After the removal of the masking layer 4, the two metal layers 9 and 11 remain on the surface, whereby the solar cell according to the invention is formed.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed is:

1. A method for producing a silicon solar cell composed of a wafer with a silicon layer, said method comprising the steps of:
    etching a layer selected from the group consisting of silicon layer that forms an emitter layer, and an already formed emitter layer, with the emitter layer having a thickness in a range of 50 nanometers up to few hundred nanometers, by using an etching medium to porosify the layer at least in one region;
    forming a patterned masking layer on a surface of a wafer side having the emitter layer to produce a region with masking layer and a region without masking layer;
    galvanically coating the porosified emitter layer in the region without masking layer with a first metal layer by contacting the porosified silicon with a metal-containing electrolyte;
    heating the emitter layer and the first metal layer until a metal silicide layer forms in at least one part of the porosified region and extends from a top side of the emitter layer in a direction to an adjacent silicon layer; and
    removing the masking layer,
    wherein the etching medium and the metal-containing electrolyte are a same electrolyte.

2. The method of claim 1, further comprising doping the silicon layer to form the emitter layer.

3. The method of claim 1, wherein the silicon layer is n-doped, said coating step includes depositing metal in and on the porosified and cathodically polarized silicon.

4. The method of claim 1, wherein the silicon layer is n-doped, said etching step including electrochemical etching with anodic polarization of the silicon layer, to form an anodically polarized region.

5. The method of claim 4, wherein, during electrochemical etching, the anodically polarized region is provided with the etching medium in such a way that the anodically polarized region is dipped into the etching medium.

6. The method of claim 1, wherein electrical contact-making for cathodic or anodic polarization of the silicon layer is effected outside the electrolyte.

7. The method of claim 1, wherein the etching medium comprises hydrofluoric acid, a tension-reducing agent, and a metal salt.

8. The method of claim 7, wherein the tension reducing agent is a surfactant, alcohol or acetic acid.

9. The method of claim 1, wherein only one side of the solar cell to be produced is exposed to an electrolyte.

10. The method of claim 1, wherein the heating step for forming the metal silicide layer is effected in a range of 250° C. to 700° C.

11. The method of claim 1, wherein the heating step for forming the metal silicide layer is effected in a range of 250° C. to 400° C.

12. The method of claim 1, wherein, after the formation of the metal silicide layer, any remaining first metal layer is removed and a first metal layer is thereupon deposited again.

13. The method of claim 1, wherein a second metal layer is formed onto the first metal layer prior to the heating.

14. The method of claim 1, wherein the masking layer comprises a resist that can be applied by means of screen printing.

* * * * *